US006348805B1

(12) United States Patent
Jackson et al.

(10) Patent No.: US 6,348,805 B1
(45) Date of Patent: Feb. 19, 2002

(54) METHOD AND APPARATUS FOR ASSIGNING PINS FOR ELECTRICAL TESTING OF PRINTED CIRCUIT BOARDS

(75) Inventors: William E. Jackson, Mission Viejo; Thomas L. Guthrie, Placentia, both of CA (US)

(73) Assignee: Mania-Barco GmbH, Gent (BE)

(*) Notice: Subject to any disclaimer, the term of this patent is extended or adjusted under 35 U.S.C. 154(b) by 0 days.

(21) Appl. No.: 09/265,666

(22) Filed: Mar. 10, 1999

Related U.S. Application Data

(60) Provisional application No. 60/077,634, filed on Mar. 11, 1998, and provisional application No. 60/077,651, filed on Mar. 10, 1998.

(51) Int. Cl.⁷ .............................................. G01R 31/02
(52) U.S. Cl. .................... 324/758; 324/754; 716/12; 716/13
(58) Field of Search ...................... 716/12–15; 324/754, 324/758, 761

(56) References Cited

U.S. PATENT DOCUMENTS 5,360,767 A  * 11/1994  Narayanan et al. ......... 437/208
6,186,676 B1 *  2/2001  Andreev et al. .............. 716/12
6,194,906 B1 *  2/2001  Yagii et al. .................. 324/758

OTHER PUBLICATIONS

Guthrie, T. Blue Granite Software, Inc. "Automatic Generation of Printed Circuit Board Custom Tooling." DMI#9424535. Brea, CA, 3/97, semi–annual.

Guthrie, T. Blue Granite Software, Inc. "Automatic Generation of Printed Circuit Board custom Tooling." DMI#9424535. Brea, CA, 9/97, semi–annual.

12 pages of printouts from internet sites—Applied Cam Engineering, Inc. Brea, CA.

Guthrie, T. Blue Granite Software, Inc. "Automatic Generation of Printed Circuit Board Custom Tooling." DMI#9424535. Brea, CA, 3/96, semi–annual.

Guthrie, T. Blue Granite Software, Inc. Automatic Generation of Printed Circuit Board Custom Tooling. DMI#9424535. Brea, CA, 9/96, semi–annual.

Guthrie, T. Blue Granite Software, Inc. Automatic Generation of Printed Circuit Board Custom Tooling. DMI#9424535. Brea, CA, 9/97–final.

* cited by examiner

Primary Examiner—Son Mai
(74) Attorney, Agent, or Firm—Knobbe, Martens, Olson & Bear, LLP

(57) ABSTRACT

A process for creating a pin assignment for a test fixture for electronic circuits is disclosed. A difficulty rating is determined for each test point on an electronic circuit. The difficult areas are assigned the pins on a test grid, with the difficulty rating of adjacent test points being iteratively determined as the process continues. If a pin cannot be assigned because of conflicts, one or more adjacent test points are reassigned pins, with the difficulty matrix being recalculated with each change and with pins being reassessed and reassigned. When all test points are assigned a pin, the pins are checked to see if they interfere with each other, and further iterations may result.

44 Claims, 7 Drawing Sheets

MEASUREMENT CONTACT ARRAY AND PCB TEST POINT GRID

PROBE PIN DEFLECTION, SIDE VIEW

ELECTRICAL TEST FIXTURE WITH THREE EXAMPLE PINS

MEASUREMENT CONTACT ARRAY AND PCB TEST POINT GRID

ELECTRICAL TEST FIXTURE WITH
THREE EXAMPLE PINS

PROBE PIN DEFLECTION,
SIDE VIEW

PIN ASSIGNMENT

INITIALIZATION

BACKTRACKING

PIN INTERFERENCE

METHOD AND APPARATUS FOR ASSIGNING PINS FOR ELECTRICAL TESTING OF PRINTED CIRCUIT BOARDS

This application claims priority from 35 U.S.C. §119(e) from Provisional Application No. 60/077,634, filed Mar. 11, 1998 and from Provisional Application No. 60/077,651, dated Mar. 10, 1998.

BACKGROUND OF THE INVENTION

1. Field of the Invention

The invention relates to electrical testing of printed circuit boards, multi-chip modules, and other planar electrical interconnect devices.

2. Background of the Invention

Numerous problems arise in testing electrical interconnect devices. These devices require simultaneously contacting a set of electrical test points distributed in a nonuniform pattern across the surface of the electrical interconnect device (the "test point grid"). The test point grid is typically planar. The test points must be connected electrically to a regular, planar grid of measurement contact points such than an isolated, conductive circuit path is created to each test point. A "measurement contact array" is held parallel to the test point grid at a distance of a few inches from the surface of the test point grid.

For illustrative purposes in the remainder of this disclosure, a printed circuit board (PCB) will be used as the exemplary item presenting the plane of points to be tested. The points to be tested on a PCB are positioned to match terminals of electrical components that will eventually be soldered to the PCB. Electrical components have their terminal connection points positioned in various patterns. The connection points are often more closely spaced than the spacing between, or pitch of, the contact points in the measurement contact array.

FIG. 1 shows a view perpendicular to the two planes (test point grid and planar contact array) for a small section of an exemplary PCB. The large crosses 22 depict measurement points on a measurement contact array 20. The solid rectangles depict test points 24 on the surface of the PCB (the test point grid). In this example, the density parallel to the rows of test points 24 is four times greater than the pitch of the measurement contact points 22.

A method of implementing the conductive path in common use in the electrical test industry is to employ rigid or semi-rigid metal "probe pins" to contact the PCB test points. A distal end of the probe pin is held in mechanical contact with a test point on the PCB and the other end is held in mechanical contact with one element of the measurement contact array. A typical probe pin has a length of 3 inches and a diameter of 0.020 inches, providing a very high aspect ratio. Longer or shorter pins are sometimes used.

Defining which measurement contact point of the measurement contact array will be connected to a particular test point by a probe pin is referred to as "assigning" a probe pin to a test point. The particular set of all assigned probe pins for an exemplary PCB is referred to in the art as a "pin assignment pattern."

Because the pattern of test points on the PCB surface does not present a regular X-Y coordinate grid, and because the area-density of these test points is greater than the measurement points of the measurement contact array, it becomes necessary to angle or lean most or all of the probe pins away from vertical in order that all of the test points be contacted simultaneously. This is called "deflection" in the trade, even though the probe pin itself is not bent. The set of all probe pins defined by a pin assignment pattern, plus the insulating mechanical structure that supports and constrains these probe pins are assembled into a mechanical appliance referred to in the trade as an "electrical test fixture."

FIG. 2a shows examples of the key elements of interest related to an electrical test fixture 28. Three example test points A, B and C are shown on test point grid 26. These points A, B and C are connected to three measurement contact points 22a, 22b and 22c by three deflected probe pins 30a, 30b and 30c. The amount that a probe pin 30 deflects away from vertical to the plane containing the measurement contact array 20 and test point grid surfaces 26 is measured as a linear distance shown as d in FIG. 2b. This distance d is the sine of the angle of deflection a multiplied by the length of the probe pin. Measuring deflection as a distance rather than as an angle is customary in the trade. This deflection assumes a straight probe 30, and that the measurement contact array 20 is parallel to the test point grid 26.

Constructing a test fixture 28 requires that a pattern of probe pins 30 be produced which simultaneously connect each test point A, B or C to a unique measurement contact point 22 without any two pins 30a, 30b or 30c coming in contact with one another. To construct a usable test fixture 28, the pins 30 must be mechanically supported in three dimensional space such that they cannot move in any direction parallel to the surface of the planes containing the measurement contact array 20 or the test point grid 26.

An ideal fixture support structure would be constructed from a solid block of insulating material of thickness equal to the distance separating the test point grid from the measurement contact array. One hole would be bored through the insulating block for each pin. The bored hole may describe a straight line, an arc, or a combination of the two. All holes that emerge from the top side of the block will have (x,y) locations that are a multiple of the grid pitch, aligning with the measurement contact array. The holes that emerge from the bottom (PCB) side of the block will match the unique pattern of test points on the test point grid.

By placing the insulating block on top of the PCB to be tested, inserting probe pins into each hole, placing the measurement contact array on top of the test fixture structure, and applying a compressive force to the entire stack, the desired electrical circuit paths connecting each test point are realized.

In current industry practice, the single, solid block of insulating material is replaced by 3 to 10 parallel plates of insulating material, separated by spacer posts at the periphery and bolted together. This assembly of plates and spacers occupies the identical volume as the solid block of the ideal fixture. It constrains the pins in an analogous manner, using one hole per pin per plate. A typical test fixture 28 will contain between 5,000 and 25,000 probe pins.

Because probe pins 30 can deflect in any direction, a multiplicity of different probe pin assignment patterns may be chosen to build test fixtures 28 for a given printed circuit board. All such fixtures 28 must have the same pattern of holes on the bottom surface for contacting the test points A, B or C in the test point grid 20. However, some or all of the probe pins 30 will be connected to different points on the measurement contact array 20. Any of the multiple probe pin patterns define valid test fixtures for a given PCB as long as all test points are connected to a unique measurement contact point.

However, certain pin assignment patterns will provide superior electrical performance to others. A commonly used measure by which to judge the relative quality of several fixtures designed for the same PCB is to compare the deflections of the most deflected pin or pins within each fixture. Given two test fixtures for the same PCB, the one with the lower maximum deflection is considered superior to those in the trade.

There is a sound physical reason for using maximum deflection as a predictor of fixture performance. As its deflection rises, the ability of a probe pin to make a reliable electrical connection to its test point decreases. At some critical deflection, electrical contact is broken. An empirical deflection limit is typically set, below which experience has shown that probe pins operate reliably. The further below this limit all pins of a fixture are deflected, the more reliable a fixture becomes, although below a certain limit, little improvement in reliability is seen.

Current Methods for Test Fixture Pin Assignment

Developing a probe pin pattern to contact 25,000 points simultaneously without shorting any two of the probe pins together is a difficult problem. Even with computer assistance, technicians skilled in the art of fixture design require from several hours to an entire day to produce a successful fixture probe pin assembly.

To successfully design a valid probe pin pattern for the construction of an electrical test fixture, the following three requirements must be met:

1. Every test point in the test point grid must be connected using a probe pin to a unique measurement contact point within the measurement contact array.

2. No probe pin may touch or otherwise interfere spatially with another probe pin.

3. No probe pin may exceed the maximum deflection limit set for the fixture.

Designing a test fixture becomes difficult when the maximum deflection for probe pins rises above 10 to 15 percent of the length of the probe pin. Computer systems can be used to aid in the construction of probe pin patterns for test fixtures. But even with computers significant difficulties arise because the pin assignment task involves searching through an exponentially large set of possible assignment patterns. For example, suppose the maximum deflection allowed for a fixture's pins places ten measurement contact points within range of each test point. If there are 10,000 points to be tested, the number of pin assignment permutations is on the order of $10^{10,000}$ (the numeral 1 followed by 10,000 zeros).

This large number of permutations precludes using any known general purpose computer to sequentially examine each permutation. Since the vast majority of these permutations will be found to violate one or more of the three rules presented above, it would take an infeasible amount of time to search without expert guidance.

Because an exhaustive search is infeasible, current software algorithms do not revisit (or revisit a finite, small number of times) a probe pin once it has been assigned. The current processes examine each test point once and assign a pin. Since such systems do not know in advance whether the pin assignment permutation pattern they are constructing will be a successful one, they invariably reach a situation where there are no unused measurement contact points within the vicinity of an untested test point. Current technology software algorithms choose from two alternatives:

1. The software halts without assigning pins to contact all test points.

2. The software assigns pins to all test points, but uses a deflection greater than the allowed maximum, or greater than that desired by the operator.

In either case, a human expert must step in and correct or guide the probe pin assignment. The human operator intervenes by removing the probe pins at and surrounding the blocked area and then manually assigning pins for the difficult test points.

SUMMARY OF THE INVENTION

The present invention provides a fully automatic means for developing a pin assignment pattern for electrical test fixtures employed in testing printed circuit boards and other planar electrical interconnect devices including, but not limited to, multi chip modules and hybrid packages. For all but very simple devices with fewer than about 1,000 pins and deflections under about 0.2 inches, the pin assignment patterns and pin arrangements produced by the invention display a lower maximum probe pin deflection than pin assignment patterns designed by human experts, whether aided or unaided by any existing software algorithms.

The present invention offers the following improvements over the current state of the art in electrical test fixture pin assignment by the novel ability to direct its search of the exponentially large pin assignment search space. The pin deflection is minimized by always working outward from the most difficult points to better distribute the deflection, and advantageously, to equalize the deflection at the outward frontier of the assignment process. Much like the ripples that radiate out at equal velocity in all directions from a pebble dropped in a pond, the pins at the perimeter of the pin assignment process for a difficult area are iteratively adjusted to have approximately equal deflection.

Concentrating the search at the perimeter of difficult areas also reduces the number of patterns that must be considered. Continually equalizing the deflection at the perimeters of difficult areas also reduces the number of patterns that must be considered.

The invention provides a deterministic method of predicting and continuously updating which test points on the test point grid surface are currently most difficult to contact with a probe pin. The invention is able to use this computation of difficulty to provide an ordering for assigning probe pins to test points.

The invention searches heuristically for alternate test point-to-measurement contact point pin assignment patterns when a dead-end is reached. The invention is able to backtrack out of a dead-end, try alternate patterns, and remember all patterns tried in order to avoid falling into an infinite loop. The invention is able to remember which configurations have been tried, and intelligently search hundreds of thousands of combinations without requiring guidance of a human operator.

The combination of the above capabilities enables the invention to efficiently sort through the exponentially large set of pin assignment patterns and locate a pattern with suitably low maximum probe pin deflection. The efficiency provided by the invention enables this automatic, directed search to be done in a reasonable time on current technology digital computer work stations. This is in contrast to standard, non-heuristic search techniques generally used by others, including software algorithms, all of which have proved unable to handle the exponential search space involved in electrical test probe pin assignment.

This invention involves a process for creating a pin assignment for a test fixture for electrical interconnect devices. A difficulty rating is determined for each test point on an electrical interconnect device. The difficult areas are assigned the pins on a test grid, with the difficulty rating of adjacent test points being iteratively determined as the process continues. If a pin cannot be assigned because of conflicts, one or more adjacent test points are reassigned pins, with the difficulty metric being recalculated with each change and with pins being reassessed and reassigned. When all test points are assigned a pin, the pins are checked to see if they interfere with each other, and further iterations may result.

BRIEF DESCRIPTION OF THE DRAWINGS

The present invention will be better understood from the description of the preferred embodiment which is given below, taken in conjunction with the drawings in which like numbers refer to like parts throughout, and in which.

DETAILED DESCRIPTION OF THE PREFERRED EMBODIMENT

Figure 1:
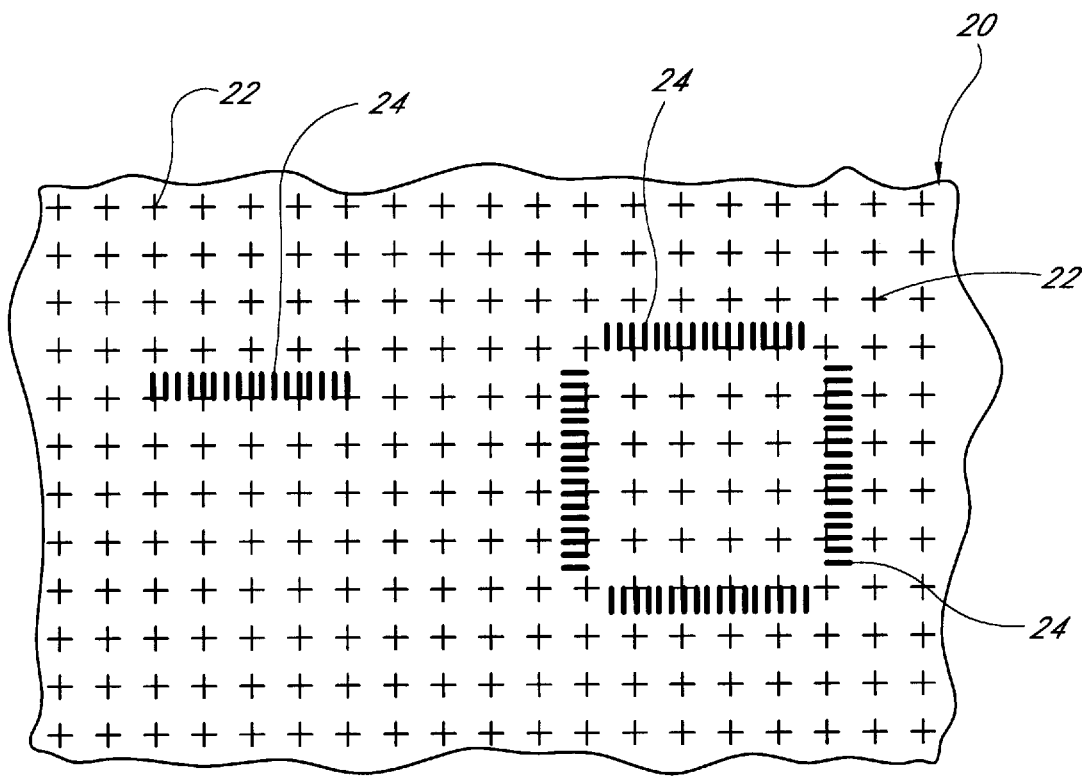
FIG. 1 is a plan view showing a measurement contract array and a test point grid for a portion of an exemplary printed circuit board.
Figure 2A:
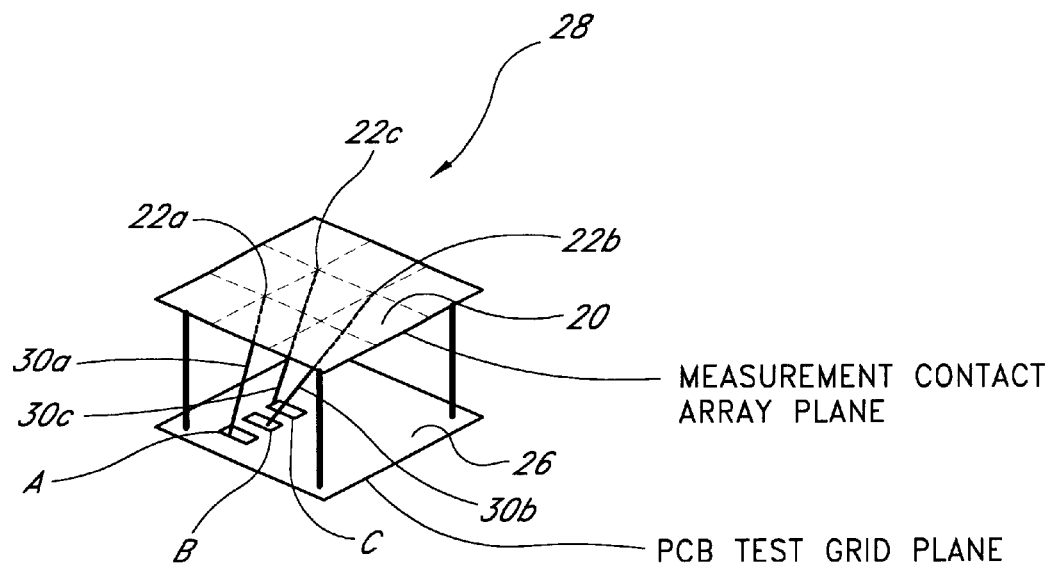
FIG. 2a shows an illustrative electrical test fixture.
Figure 2B:
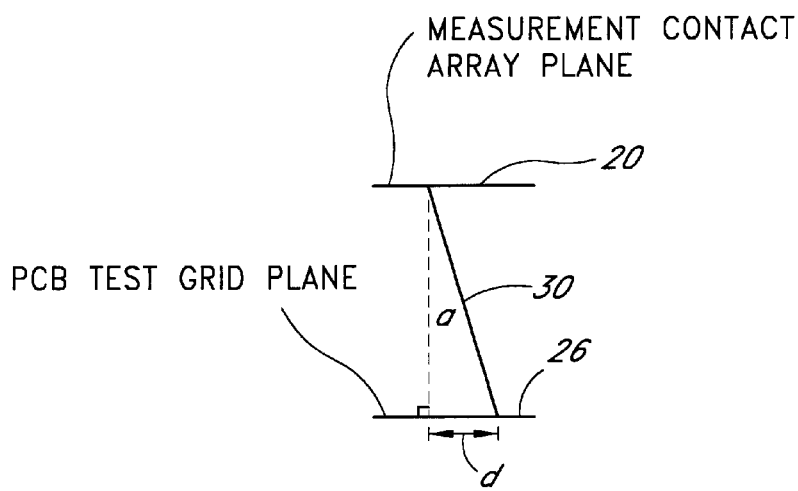
FIG. 2b shows a side view of a probe pin in an illustrative electrical test fixture.

The following terms will be given the following meanings in this description, with general reference to FIGS. 1 and 2.

"Candidate" means a grid point 22 which can potentially be used for probing a test point 24, and which can be marked to indicate which grid points have previously been considered.

"Grid point" means a single point 22 in the measurement contact plane.

"Grid point array" refers to an array 20 that contains grid points 22 that allows fast geometric search. The grid point array 20 is typically a planar array.

A "pin" refers to a single probe pin 30 connecting a grid point 22 to a test point 24.

A "test point" refers to a single point of a PCB to be tested.

A "test point grid" refers to a container of test points 24 that allows fast geometric search. The test point grid 26 is typically on a planar surface.

The maximum deflection (MaxDefl) of probe pin 30 that is allowed is referred to as the maximum deflection. It typically represents a distance in the plane of the test point 24, akin to the distance d in FIG. 2b. While the deflection of probe pin 30 actually defines a cone with its apex at a contact point 20, the industry practice is to view the deflection as the distance measured in the plane of the test points 24. Thus, in a practical sense, it represents the distance that the distal end of probe pin 30 can move to contact a test point 24 while the other end of the probe connects to a measurement contact point 20. The maximum deflection is typically a constant value, and generally about 10% of the probe length. Thus, for a three inch long probe 30, the maximum deflection is typically about 0.3 inches. But the specific values can vary with the probe and use.

The minimum space required between center lines of pins 30 is referred to as the minimum space, or Min. Space. Typically, the minimum space is sufficient to avoid physical contact among the various probe pins 30, and sufficiently large to prevent electrical interference among the various pins 30. The diameters and electrical criteria can vary among the pins 30 used in a single test fixture.

The maximum number of pins 30 that have been assigned thus far is referred to as the "MaxPins." The maximum pin deflection currently used is referred to as the "search radius". A preferred pin deflection is less than the maximum deflection, and represents a desired deflection that presumably results in an improved electrical fixture.

The objective of the pin assignment sequence or method is, for a given a set of test points 24 and a set of grid points, to assign a unique grid point to probe each test point 24, such that the maximum pin deflection is limited and that the pin does not interfere with any other pins. This effectively assigns a pin 30 to only one test point 24 and only one measurement contact 20, in a way that minimizes the maximum deflection. This also minimizes the absolute distance or path length between test points 24 and associated measurement contact points 20. Depending on the exact details of the way the pins 30 are assigned, the average deflection may vary from a minimum value in order to avoid or reduce maximum deflection and avoid deflections with an unacceptable value.

Figure 3:
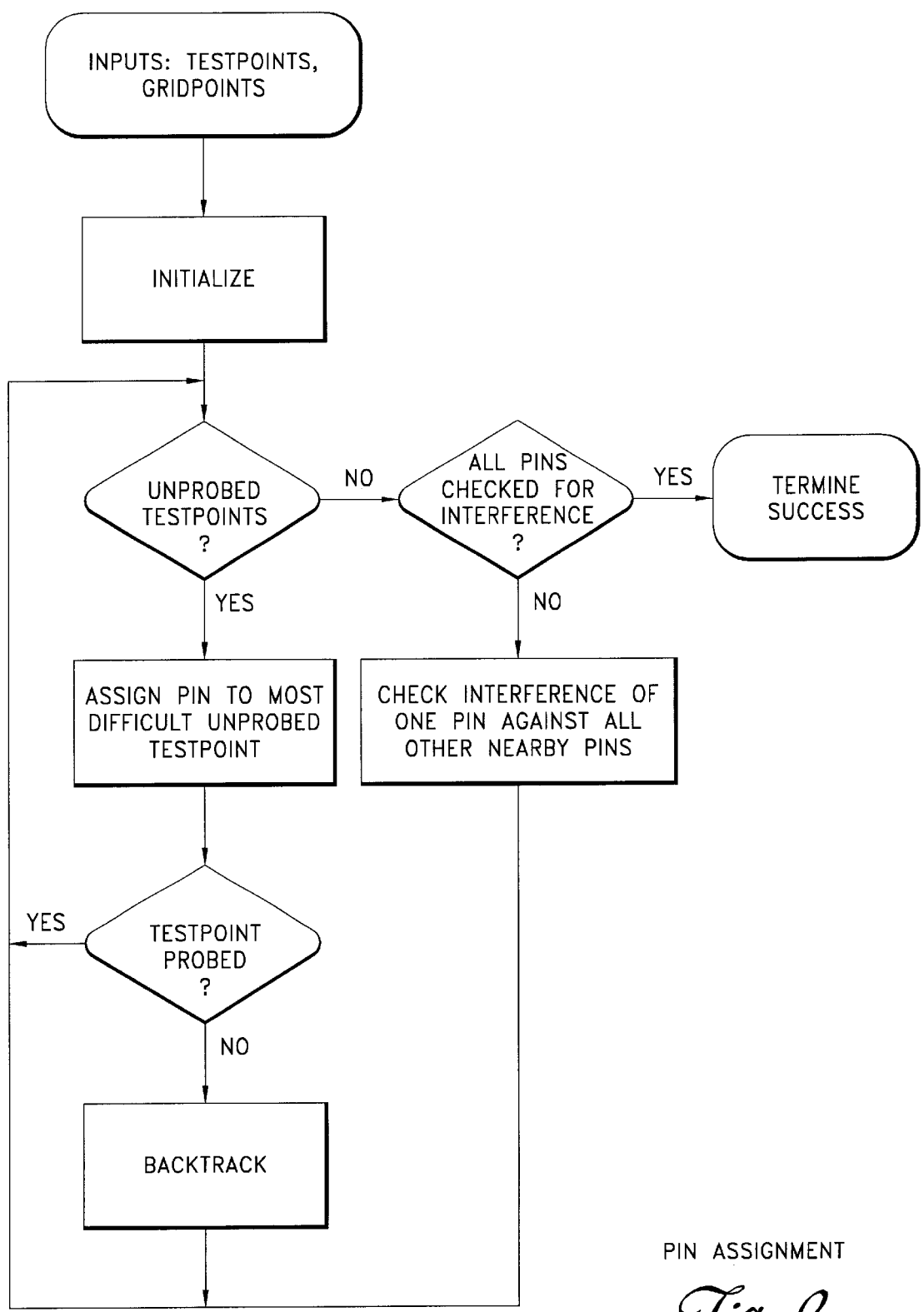
FIG. 3 is a flow chart of a pin assignment sequence of this invention.

The process used to assign the pins 30 to the test points 24 is divided into four broad groups of steps or algorithms: initialization, assignment, backtracking, and interference. The Assignment algorithms assign pins 30 first to those test points 24 that are most difficult to probe. If, during assignment of pins 30, a test point 24 is found that cannot be probed with any currently unused grid point or measurement contact point 20, then the Backtracking algorithms are used to re-arrange the current pin assignment. Once all pins 30 have been assigned to all test points 24, the Interference algorithms are used to detect and correct any interference between pins 30. The Interference algorithms may reject pins 30, causing the Assignment and Backtracking algorithms to become active again. This broad sequence is shown in the flowchart of FIG. 3.

Initialization

Figure 4:
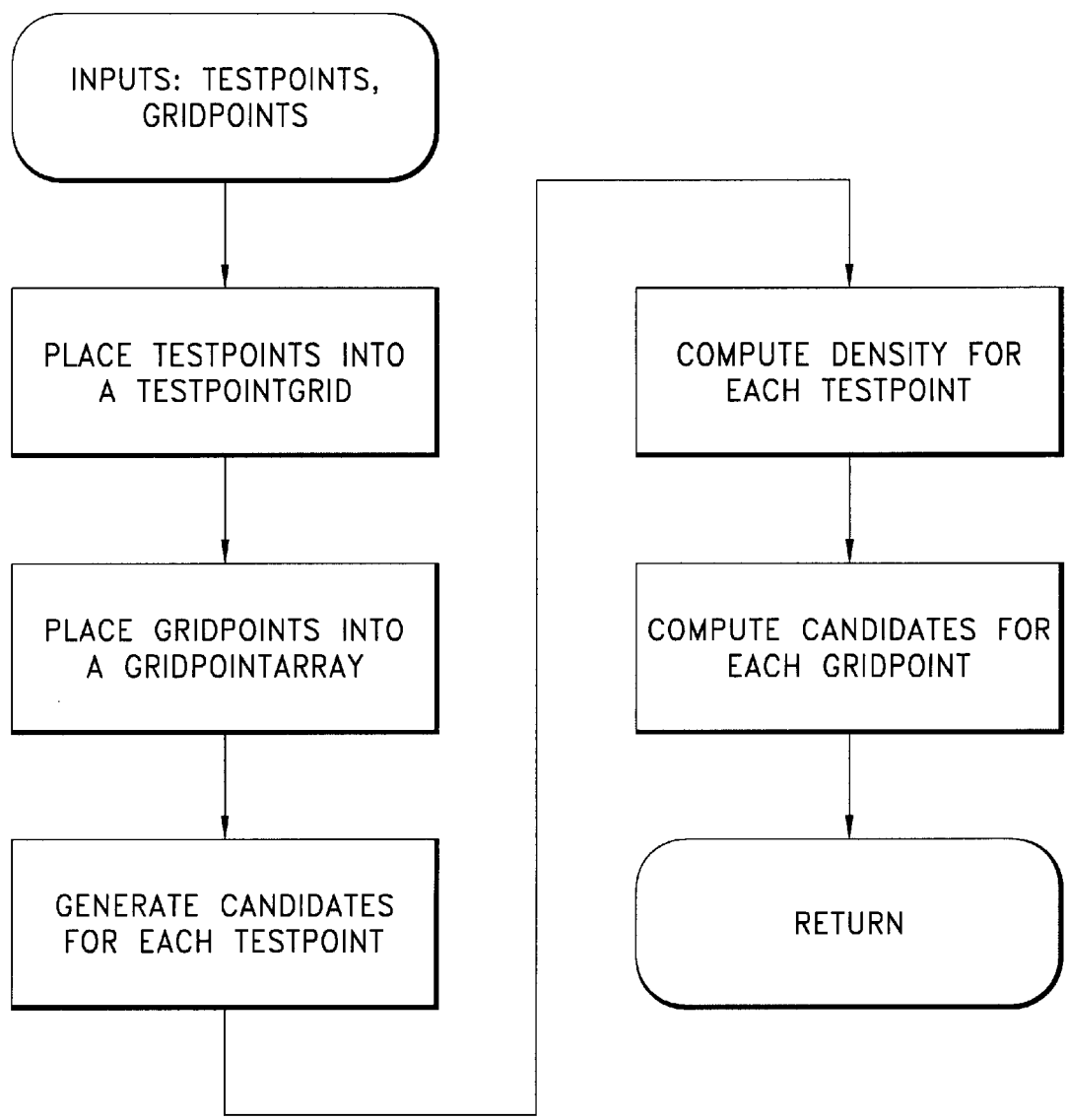
FIG. 4 is a flow chart of an initialization sequence of this invention.

Referring to FIG. 4, the purpose of this initialization sequence of steps is to initialize the data structures. It is advantageously executed only once. The sequence comprises inserting all test points 24 into a test point grid 26 and all grid points 20 into a grid point array, or a measurement contact array 20, in order to facilitate geometric searches.

For each test point 24, examine the grid point array 20 to find those grid points 22 that are within a radius of maximum deflection (MaxDefl) of the test point 24. For each such grid point add a Candidate entry to the test point 24, and repeat the task until you generate a list of all Candidates for each test point 24. The list of Candidates represents all possible pins 30 that could be assigned to this test point 24. The entries in this list are marked to indicate which pin assignments have already been examined and rejected.

Next, for each test point 24 in the test point grid 26, examine the test point grid to determine the number of nearby test points 24 that may compete for use of the same grid points 22. Set the following attribute for each test point 24:

$cp_{density}$≡number of test points 24 within radius MaxDefl of test point

For each contact grid point 22, examine the test point grid 26 to determine the number of nearby test points 24 that may consider this grid point 22 to be a candidate for probing. A nearby test point 24 is one that is within the maximum deflection (MaxDefl) of the probe 30 that will achieve acceptable performance results. Set the following attribute for each grid point 22:

$gp_{candidate}$≡number of test points 24 within radius MaxDefl of grid point Assignment Referring to the flowchart in FIG. 5, the purpose of this set of steps is to assign a pin 30 to the unprobed test point 24 that is currently the most difficult to probe—as described in more detail later. The assignment sequence determines the most difficult test point 24 to probe. For each test point 24, maintain a difficulty metric, rating or index that estimates how difficult this test point 24 will be to probe. This metric is updated dynamically as pins 30 are assigned. The metric, or difficulty index, represents a number based on a weighted combination of the number, density and location of competing test points 24.

To determine the difficulty metric for a single test point 24, search the Candidate list for the unused and unmarked grid point that is closest to the test point 24. If there is no unused grid point within SearchRadius radius of the test point 24, then difficulty is set to infinity, ∞. If there is an unused grid point, then the difficulty metric is computed as follows:

$d_{gp}$=distance from test point 24 to nearest unused grid point distance=10000*(MaxDefl-$d_{gp}$)

competition=10*($gp_{candidate}$)-2 density=1*$cp_{density}$ difficulty=distance+competition+density

The 10,000 figure in the distance calculation represents a weighted value and a correction value. Deflection is represented in inches. The distance calculation is weighted such that a change of 0.010 inches in $d_{gp}$ will be an order of magnitude greater in importance than the next closest value—"Competition". The competition is weighted by a factor of 10 over the density, and the density has a weighting factor of 1.

The weighting factors provide a clear demarcation among the three factors of distance, competition and density. The weighting factors give the greatest importance to the distance, lesser importance to the competition, and least importance to the density. Because the weighting factors are constant, the result is that if two test points 24 have the same density, the difficulty will be clearly based on the remaining two factors of competition and distance. If two test points 24 have the same density and competition values, then the difficulty will be clearly based on the remaining factor—distance. Other weighting factors, and other weighting schemes can be used or developed by those skilled in the art given the present disclosure.

Assign pin to most difficult test point 24. Find the test point 24 with the largest difficulty metric or difficulty rating. Examine the grid point array 20 to determine which unused grid point 22 is nearest to this test point 24. If there are two equally near grid points 22, then the program will select whichever it encounters first. Assign a pin between the test point 24 and the nearest grid point 22. Mark the test point 24 as needing to be checked for pin interference.

Update difficulty metric for used grid point. Examine the test point grid 26 for all test points 24 within a search radius of the used grid point 22. For each such test point 24, update the difficulty metric. This provides an iterative process that continually updates the difficulty metric of the test points 24 adjacent each test point that is being assigned a new difficulty metric. This results in a better distribution of the deflection lengths, and makes the deflection lengths more uniform.

Backtracking

Figure 6:
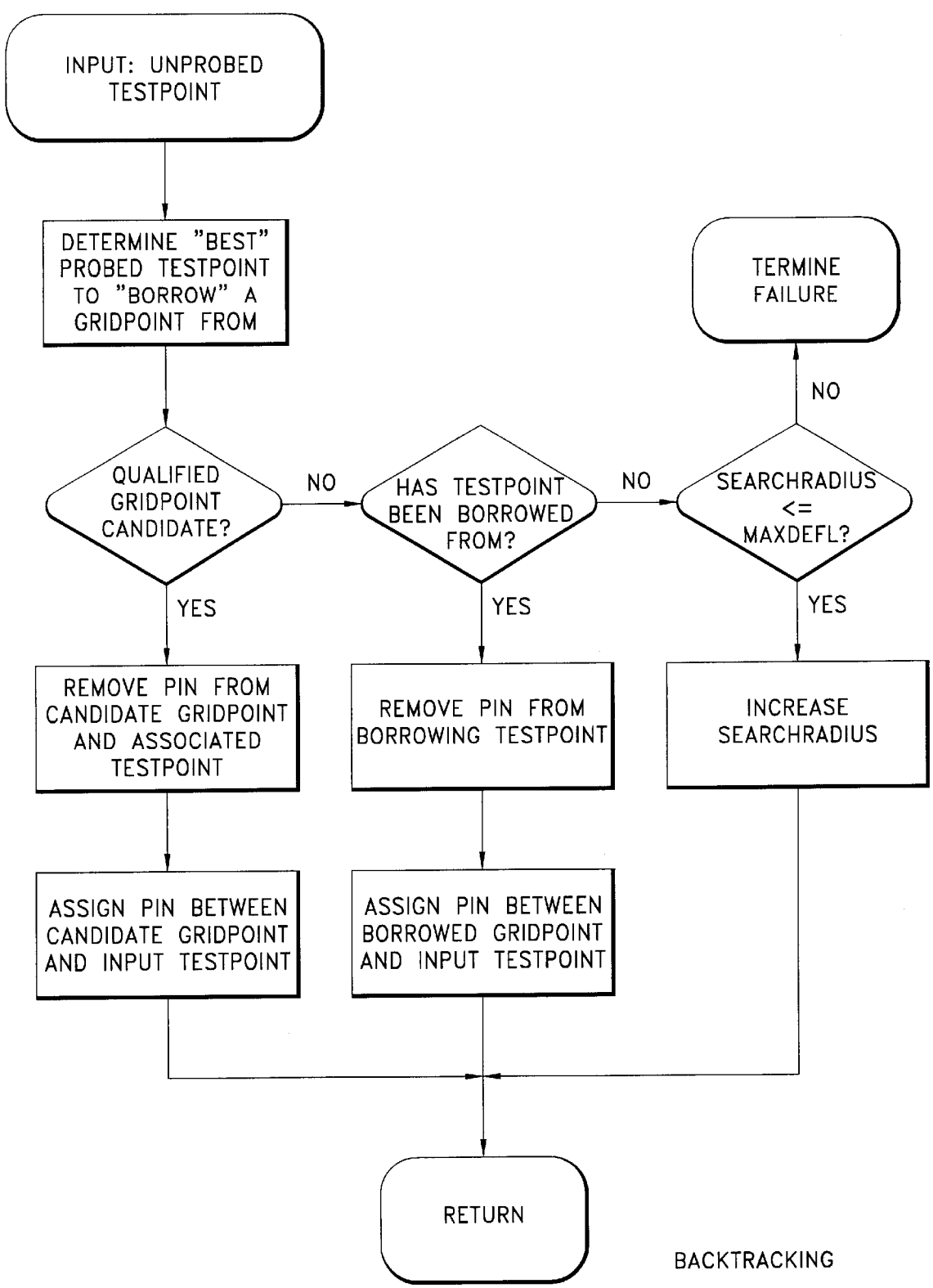
FIG. 6 is a flow chart of a backtracking sequence of this invention.

Referring to the flowchart in FIG. 6, the Backtracking sequence will be described. The purpose of this algorithm is to re-arrange the Pin assignment pattern when the process becomes "stuck", as may occur when no grid points 22 are available to be assigned to a test point 24. Because the number of possible patterns is so large that exhaustive search is infeasible, a heuristically informed search is employed. Advantageously, the search is of the type discussed in Winston, Artificial Intelligence, 3rd Ed, ch. 4, which is incorporated herein by reference.

Heuristic backtracking is triggered when the most difficult unprobed test point 24 has no nearby unused grid point 22—i.e. all nearby grid points 22 are already used to probe other test points 24. An attempt is made to "borrow" a nearby grid point from probed test point 24.

The heuristic measure used to guide the search requires examining the nearby probed grid points 22 and computing a "best candidate" score for each. This computation is described in a following paragraph. The grid point 22 with the highest "best candidate" score is then selected for borrowing. If multiple grid points 22 have equally high scores, the first one encountered by the program is selected.

It is possible that no qualified candidate grid point 22 is found to borrow from. If so, the unprobed test point 24 which cause the process to become "stuck" is examined. There are two outcomes of this examination.

First, the unprobed test point 24 may itself have been "borrowed from" by a nearby test point 24 which had become stuck earlier. If so, this earlier borrowing is undone by taking back the grid point 22 from the test point 24 that originally borrowed it.

Alternatively, the unprobed Test Point may not currently be "lending" a grid point 22 to another test point 24. In this case, we increase the Search Radius. If this increase would result in a Search Radius greater than MaxDefl, the Pin assignment problem is unsolvable and the process terminates. The user is notified with a diagnostic text message.

Whenever a pin 30 is borrowed for a test point 24, mark the candidate grid point 22 as having been borrowed. Although not required, advantageously, this mark shall remain active until such time as the test point 24 takes back the grid point 22 from the test point 24 that originally borrowed it.

Best Candidate for Borrowing

If a predetermined number of borrows have occurred, there is no qualified borrowing candidate. A predetermined number of 1000 consecutive borrows may advantageously be used to indicate that no qualified borrowing candidate exists, although other numbers may be used. If this predetermined maximum borrowing number is reached, examine all grid points 22 within the search radius of this test point 24. Do not consider any candidate grid points 22 that have been marked during this backtracking cycle as having been previously borrowed. From the remaining candidates, choose the grid point 22 with the lowest current deflection that would yield the highest deflection if borrowed. Given the present disclosure, other criteria may be used for selecting which candidate grid point 22 to borrow from, such as borrowing from grid points 22 that are a preferred distance away where the preferred distance is less than the maximum deflection distance. Thus, other candidates can be used, but the probe 30 resulting in the highest deflection is the preferred candidate. This final deflection-based ordering of candidates is computed as follows:

$d_{new}$=distance between the grid point 22 and the unprobed test point 24

$d_{old}$=distance between the grid point 22 and the currently probed test point 24 desirability=$d_{new}$−$d_{old}$

This heuristic measure of desirability embodies four properties. First, it prevents infinite cycles by maintaining a record of the borrowing cycle. Second, it prunes areas of the search as unprofitable after exploring for a finite number of consecutive borrows. Third, it generally ranks grid points 22 further from the "stuck" point as more desirable than those nearby. Fourth, it ranks as more desirable grid points 22 that have not been previously borrowed. The last two properties encourage the backtracking algorithm to move away from congested areas in a meandering path. Alternative heuristic measures that also embody most, or all of these properties could also be used.

Figure 5:
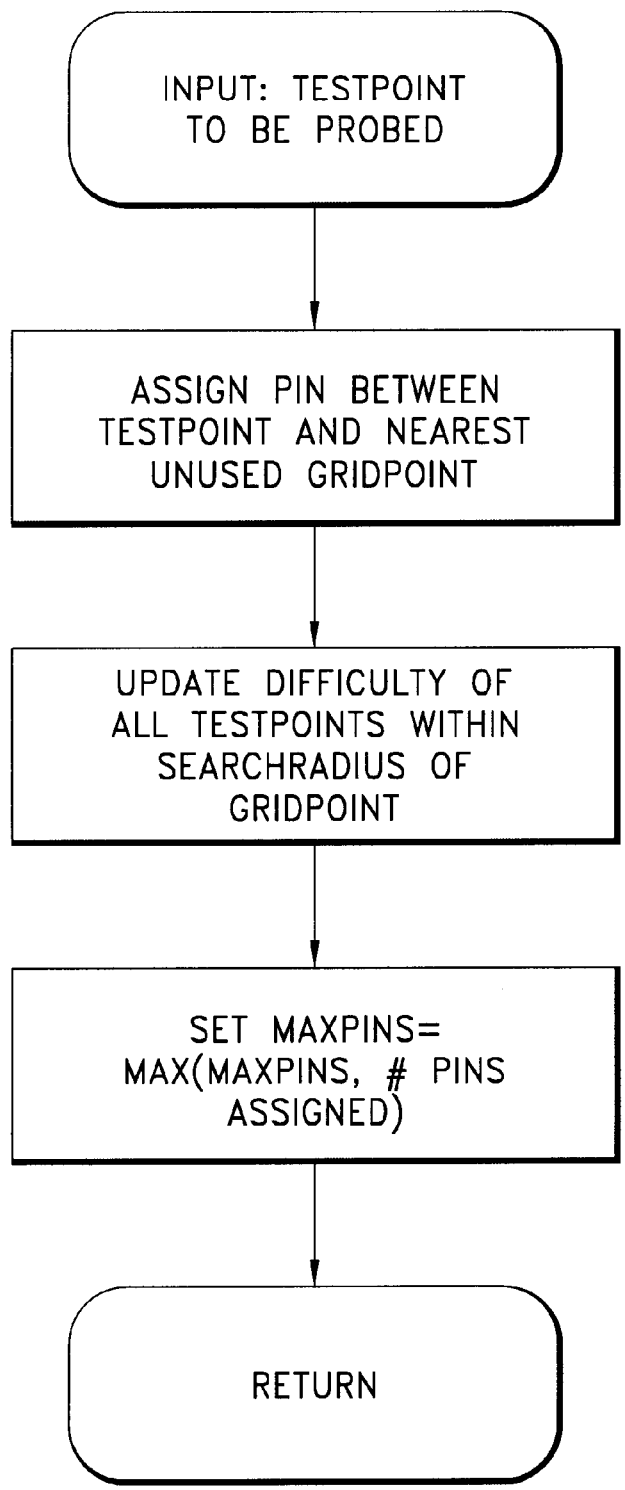
FIG. 5 is a flow chart of a sequence for assigning a single probe pin to a test point.

As discussed relative to FIG. 5, a record of the greatest number of pins ever assigned is maintained. Whenever this greatest number reaches a new high ("high water mark"), all borrowing is declared permanent and all candidate grid points 22 for all test points 24 have all borrowing marks canceled.

Interference

The purpose of this algorithm is to detect and correct any interference between pairs of pins 30. Interference calculations are typically performed in the industry using straight lines for the path of probes 30, although it is possible to evaluate interference using curved probes, or probes with curved and straight segments. Determining whether or not two pins 30 interfere is accomplished by computing the distance between the center lines of the pins 30. If the distance is greater than the diameter of the pins 30, plus some tolerance to accommodate for position errors and electrical interaction, then they do not interfere. Typically, for probe pins 30 about 3 inches long and 0.020 inches in diameter, a minimum space of about 0.025 inches is often used. The constant MinSpace or minimum space is used to indicate this distance.

Figure 7:
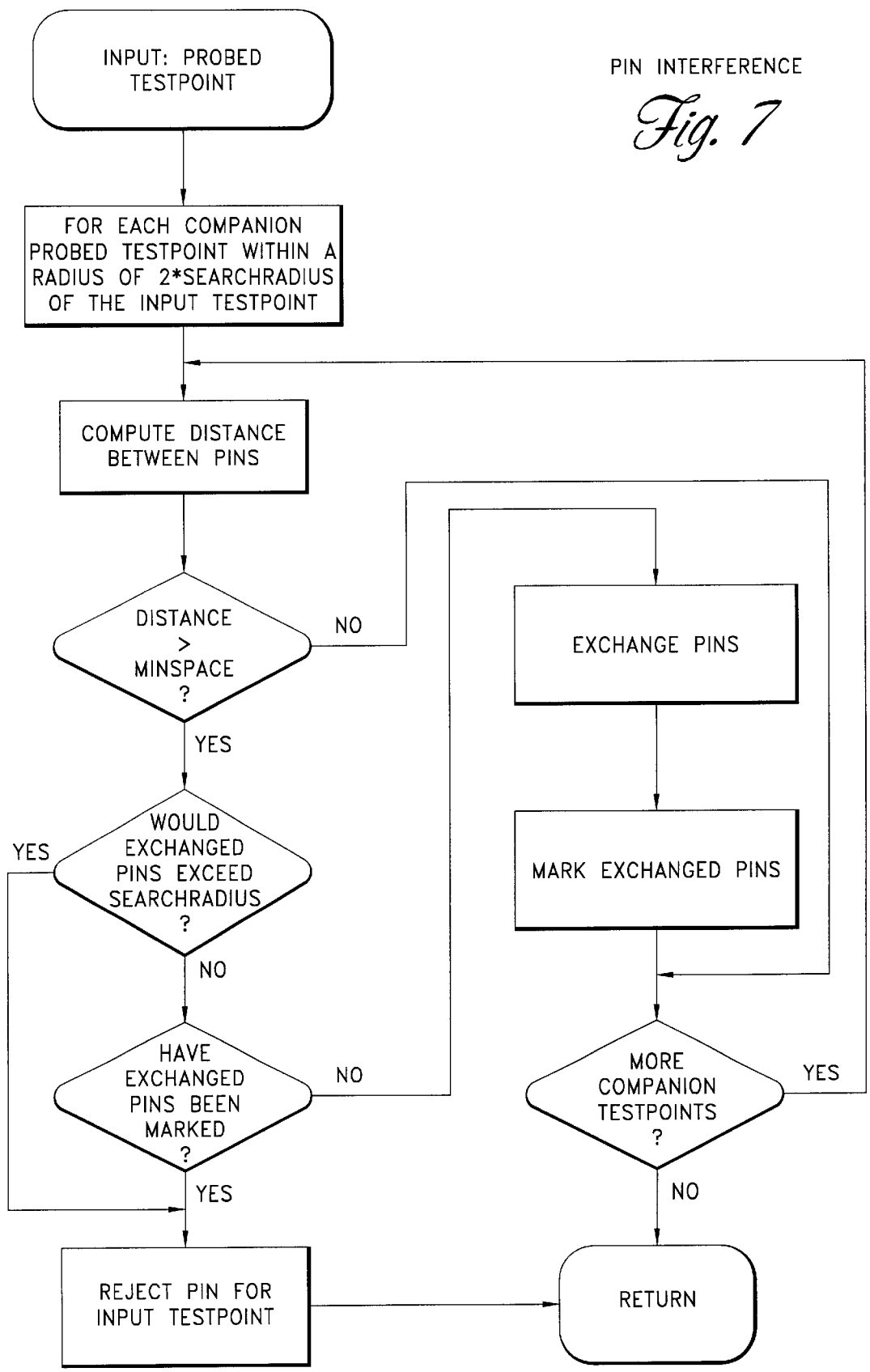
FIG. 7 is a flow chart of a pin interference and checking sequence as used in this invention.

Referring to the flowchart in FIG. 7, given a probed test point 24, the sequence is to examine all nearby probed test points 24 to evaluate the space between the center lines of the associated pins 30. Only test points 24 within a radius of 2 SearchRadius need be examined, since this encompasses all probe pins 30 that could possibly interfere, overlap or contact each other.

If a distance of less than MinSpace is found between any pair of pins 30, attempt to provide sufficient space by exchanging the two pins 30. Do not perform the exchange if it would result in deflection greater than SearchRadius, or if the Candidate grid point are marked as having between previously exchanged.

If the exchange is performed, mark the Candidate grid points used as having been exchanged, and mark both test points 24 as needing to have pins 30 checked for interference. If the exchange does not result in removing the interference, then the backtracking sequence can be re-initiated.

The above set of steps describes the sequence for determining an improved location for probe pins 30 used in a test fixture 28. The resulting test fixture is believed to have improved testing accuracy and reliability characteristics compared to prior art test fixtures using pin layouts determined by prior art methods. Once the pin layout is determined, one skilled in the art can make a test fixture 28 without undue experimentation, and thus the steps for making the test fixture are not described in detail herein. But because the resulting test fixture 28 is improved, this invention encompasses the test fixture 28 embodying the pin layout determined by the method of this invention.

While the above sequence can be implemented by a person performing individual calculations for each pin, the invention is preferably used in connection with a computer suitably programmed to perform the above steps. As mentioned above, current pin layout systems check for interference among the pins, and the software and other means to do this are known in the art. Given the above disclosure, a computer programmer skilled in the art is believed capable of developing software to implement the above described sequences of steps, without undue experimentation.

Although an exemplary embodiment of the invention has been disclosed for purposes of illustration, it will be understood that various changes, modifications and substitutions can be incorporated in the disclosed embodiment without departing from the spirit of the invention disclosed herein. This includes using only portions of each of the above sequences separate from the remaining sequences, and within each sequence, applying the individual sequence to less than all the pins in a test fixture.

What is claimed is:

1. A method for determining a pin layout for a test fixture for an electrical interconnect device, the test fixture having a plurality of test points each of which is to be connected to one of a plurality of grid points using one of a plurality of pins that is associated with said one of a plurality of grid points, comprising the steps of:

for each of a plurality of said test points, identifying adjacent grid points that are within a first predetermined deflection distance;

determining a difficulty metric for each of said plurality of test points based on the number, density and location of competing test points;

assigning one of said pins and its associated grid point to each of said test points according to the difficulty metric, with the test points having the highest difficulty metric being assigned pins first; and redetermining the difficulty metric for those test points within a maximum deflection distance of each test point as it is assigned a pin.

2. A method as defined in claim 1, comprising the further step of:

determining if a pin cannot be assigned to a test point because all adjacent grid points and their associated pins have been assigned, and if so, then identifying the test points within said predetermined distance of the test point that cannot be assigned a pin, and selecting one of the pins associated with those test points to borrow a pin from, and redetermining the difficulty metric for the borrowed pin and the other pins associated with said test points that were considered for borrowing.

3. A method as defined in claim 2, comprising the further step of:

determining if a pin cannot be assigned to a test point because all adjacent grid points and their associated pins have been assigned, and if so, borrowing a pin previously assigned to a test point within said predetermined deflection distance of the test point that could not previously be assigned a pin.

4. A method as defined in claim 2, comprising the further step of determining whether any pins interfere with each other and identifying any pins having such interference.

5. A method as defined in claim 2, comprising the further step of determining whether any pins interfere with each other, identifying any pins having such interference, and for at least one pair of identified interfering pins, exchanging the test points that are connected to the pins.

6. A method as defined in claim 4, comprising the further step of determining whether any pins interfere with each other, identifying any pins having such interference, and for at least one pair of identified interfering pins, identifying other test points within said predetermined distance of one of the test points associated with an interfering pin and selecting one of the pins associated with those other test points to borrow a pin from, and redetermining the difficulty metric for the borrowed pin and the other pins associated with said test points that were considered for borrowing.

7. A test fixture having pins assigned according to the method of claim 1.

8. A test fixture having pins assigned according to the method of claim 6.

9. A method for determining a pin layout for a test fixture for an electrical interconnect device, the test fixture having a plurality of test points each of which is to be connected to one of a plurality of grid points using one of a plurality of pins, each pin having a maximum permitted deflection, comprising the steps of:

selecting a first test point and identifying adjacent test points that are within a predetermined pin deflection as being close enough to compete with grid points that may be assigned to the first test point, and assigning a test point density number based on the number of test points so identified, and repeating the selecting, identifying and test point density number assigning steps for each of the plurality of test points;

selecting a first grid point within a first predetermined pin deflection of the first test point, and identifying the grid points adjacent that first grid point that are within a second predetermined pin deflection, and assigning a grid point density number to the first grid point based on the number of adjacent grid points so identified, and repeating the grid point selecting, grid point identifying and grid point density number assigning steps for each of the plurality of grid points;

ranking a plurality of the test points based on at least one of (a) the resulting pin deflection needed to connect a grid to the test point, (b) the grid point density number, and (c) the test point density number;

using the ranking to identify a test point that is difficult to connect to a grid point with a pin and assigning a pin to that test point, and repeating the pin assigning step for each of the non-assigned pins; and backtracking the assigning step if there are no pins to assign to an unassigned test point.

10. A method as defined in claim 9, wherein the backtracking step comprises the step of taking an assigned pin and reassigning it to the unassigned test point and repeating the ranking and assigning steps to assign a pin to the grid point from which the reassigned pin was taken.

11. A method as defined in claim 9, wherein the ranking step is performed after each pin assigning step.

12. A method as defined in claim 10, wherein the ranking step is performed after each pin assigning step.

13. A method as defined in claim 9, wherein the ranking step is based on the distance between test points.

14. A method as defined in claim 9, wherein the ranking step is based on the distance between test points and the grid point density number.

15. A method as defined in claim 11, wherein the ranking step is based on the distance between test points and the grid point density number.

16. A method as defined in claim 11, wherein at least one of the predetermined lengths is the maximum permitted pin deflection.

17. A method as defined in claim 11, comprising the further step of making a test fixture having pins located as determined by said method.

18. A method as defined in claim 11, comprising the further step of determining whether any of the pins interfere with each other, and if two pins interfere, then switching said pins.

19. A method as defined in claim 18, wherein if pins still interfere with each other after being switched, repeating the calculating, assigning and recalculating steps to reassign previously assigned pins.

20. A method as defined in claim 11, wherein if no grid point is available and a previously reassigned pin could connect to the unassigned test point, then undoing the previous reassignment and connecting the pin to the unassigned test point, and repeating the calculating, assigning and recalculating steps to reassign previously assigned pins.

21. A method for determining a pin layout for an electronic test fixture having a plurality of test points each of which is to be connected to one of a plurality of grid points using one of a plurality of pins, comprising the steps of:

inserting a plurality of said test point locations into a test point grid;

inserting a plurality of grid point locations into a grid point grid; and assigning a pin between the test points and grid points based on a predetermined algorithm that ranks the test points to identify those that are assigned pins first, wherein if the pin assigning step can no longer assign a pin when there is an unassigned test point and at least one grid point left, then taking a previously assigned pin within an acceptable pin deflection distance and reassigning it to the unassigned test point, and repeating the assigning step.

22. A method as defined in claim 21, comprising the further step of recalculating the pin assignment algorithm to re-rank the test points after each pin is assigned.

23. A method as defined in claim 21, wherein the assigning step is determined by the deflection of the pin.

24. A method as defined in claim 23 wherein the assigning step is also determined by the number of grid points within a predetermined deflection distance of the test point.

25. A method as defined in claim 21, wherein the assigning step is determined by the number of grid points within a predetermined deflection distance of the test point.

26. A method as defined in claim 21, wherein the assigning step is determined by the number of other test points within a predetermined deflection distance of the test point.

27. A method as defined in claim 21, wherein if a pin is reassigned the pin being reassigned is selected as having the greatest permissible deflection.

28. A method as defined in claim 21, comprising the further step of making a test fixture having pins located as determined by said method.

29. A method as defined in claim 21, comprising the further step of determining whether any of the pins interfere with each other, and if two pins interfere, then switching the interfering pins.

30. A method as defined in claim 29, wherein if pins still interfere with each other after being switched, repeating the calculating, assigning and recalculating steps to reassign previously assigned pins.

31. A method for determining a pin layout for an electronic test fixture having a plurality of test points each of which is to be connected to one of a plurality of grid points using one of a plurality of pins that is within a maximum deflection distance of said test point, comprising the steps of:

calculating a ranking index for a plurality of test points;

assigning a pin to one of said plurality of test points based on the ranking index;

recalculating the index for the remaining test points that have not been assigned a pin; and repeating the calculating, assigning and recalculating steps.

32. A method as defined in claim 31, wherein the step of repeating the calculating, reassigning and recalculating steps are repeated until either (a) all the test points are assigned, or (b) there are no available grid points for an unassigned test point.

33. A method as defined in claim 32, wherein if there are no available grid points for an unassigned test point, then comprising the further steps of reassigning a previously assigned pin to the unassigned test point, and repeating the calculating, assigning, recalculating and reassigning steps to assign further pins.

34. A method as defined in claim 32, wherein the ranking index is based on at least one of: (a) the density of test points surrounding the test point being assigned a pin, and (b) the density of grid points surrounding a grid point which is being considered being assigned a pin.

35. A method as defined in claim 32, wherein the assigning step is determined by a deflection of the pin.

36. A method as defined in claim 32, wherein the assigning step is determined by the number of grid points within a predetermined deflection distance of the test point.

37. A method as defined in claim 32, wherein the assigning step is determined by the number of grid points within a predetermined deflection distance of the test point and a deflection of the pin.

38. A method as defined in claim 32, wherein the reassigning step further comprises reassigning a pin having the greatest permissible pin deflection that has not been previously reassigned.

39. A method as defined in claim 32, comprising the further step of making a test fixture having pins located as determined by said method.

40. A method as defined in claim 32, comprising the further step of determining whether any of the pins interfere with each other.

41. A method as defined in claim 39, wherein if pins interfere with each other, switching the interfering pins.

42. A method as defined in claim 40, wherein if pins still interfere with each other after being switched, repeating the calculating, assigning and recalculating steps to assign further pins.

43. A method as defined in claim 32, wherein if no grid point is available and a previously reassigned pin could connect to the unassigned test point, then undoing the previous reassignment and connecting the pin to the unassigned test point, and repeating the calculating, assigning and recalculating steps to assign further pins.

44. A method as defined in claim 42, wherein if no grid point is available after the undoing and reassignment, then the assigning step is performed based on the number of grid points within a predetermined distance of the unassigned test point, and said predetermined distance is increased so long as said distance does not exceed a maximum permissible deflection.

* * * * *